United States Patent

Takahashi et al.

[11] Patent Number: 5,613,000
[45] Date of Patent: Mar. 18, 1997

[54] METHOD AND APPARATUS FOR CHANGING THE DATA SETTING MODES IN A BONDING MACHINE

[75] Inventors: Kuniyuki Takahashi, Musashimurayama; Shinichi Kumazawa, Higashikurume, both of Japan

[73] Assignee: Kabushiki Kaisha Shinkawa, Tokyo, Japan

[21] Appl. No.: 943,517

[22] Filed: Sep. 11, 1992

[30] Foreign Application Priority Data

Sep. 11, 1991 [JP] Japan ................................ 3-258771

[51] Int. Cl.$^6$ ........................................ G11B 23/28
[52] U.S. Cl. ......................... 380/3; 380/49; 364/188; 228/102; 228/1.1; 228/4.1
[58] Field of Search .......................... 380/3, 4, 20, 49; 364/188; 228/1.1, 4.1, 4.5, 8, 102

[56] References Cited

U.S. PATENT DOCUMENTS

| 4,281,379 | 7/1981 | Austin | 364/102 |
| 4,679,137 | 7/1987 | Lane et al. | 364/188 |
| 4,805,089 | 2/1989 | Lane et al. | 364/188 |
| 4,854,494 | 8/1989 | von Raben | 228/102 |
| 4,967,381 | 10/1990 | Lane et al. | 364/551.01 |
| 5,207,370 | 5/1993 | Mochida et al. | 228/102 |
| 5,221,037 | 6/1993 | Terakado et al. | 228/102 |
| 5,225,974 | 7/1993 | Mathews et al. | 364/140 |
| 5,251,125 | 10/1993 | Kamowski et al. | 364/189 |

Primary Examiner—David C. Cain
Attorney, Agent, or Firm—Koda and Androlia

[57] ABSTRACT

In bonding machines such as a wire bonding machine, a lock which makes the changing of bonding data impossible is placed on specific data setting mode items, which are stored in a memory, via a data setting mode locking circuit. The changing of data in such locked data setting modes is made possible only if a password inputted is the same as a previously set-in password.

2 Claims, 4 Drawing Sheets

METHOD AND APPARATUS FOR CHANGING THE DATA SETTING MODES IN A BONDING MACHINE

BACKGROUND OF THE INVENTION

1. Field of the Invention

The present invention relates to a method and apparatus for changing the data setting modes in a bonding machine.

2. Prior Art

In bonding machines used for manufacturing semiconductor devices, etc., there are several different types of functions for accomplishing the necessary bonding steps. As the level of these functions becomes higher and higher, the number of items of data setting modes and the range or the amount of data settings made therein are also increased. As a result, the setting of data is gradually becoming very difficult especially for workers who are not thoroughly familiar with all of the functions of the bonding machine.

Among the data setting mode items, there are several items which can be set by workers who have a low level of data setting skill. On the other hand, if the type of semiconductor devices to be worked changes, it is usually necessary only to change a part of the stored data, and such a change, in some cases, may be handled by workers with a low level of skill.

In conventional bonding machines, since no careful attention is paid to the changing of data on data setting items, when the data change is done by workers with a low level of data setting skills, errors can easily occur. Accordingly, in the conventional bonding machines, data setting is always performed by workers who have a high level of data setting skill.

SUMMARY OF THE INVENTION

The object of the present invention is to provide a method and apparatus for data setting in a bonding machine which makes it possible to improve and simplify supervision by placing restrictions on some items of data setting and placing no restriction on the remaining items depending upon the skill level of workers.

In order to accomplish the object, the present invention is characterized in that a locking or security system which disallows the changing of data is installed on items containing particular data, and the release of the locking or security system and the change of data of the locked data items can be made only by the use of a specific password.

More specifically, among the items of various data, items containing important data are locked so that access and the performing of data setting therein are not allowed without using a specific password. Furthermore, the important items cannot be unlocked without using the password. Accordingly, by locking the particular or important items and not the less important items, the changing of data of the locked items can be performed in accordance with the skill level of workers. As a result, incorrect operation is avoided and the control and operability of the bonding machine is improved greatly.

DETAILED DESCRIPTION OF THE INVENTION

One embodiment of the present invention will be described below relative to a wire bonding machine.

Figure 1:
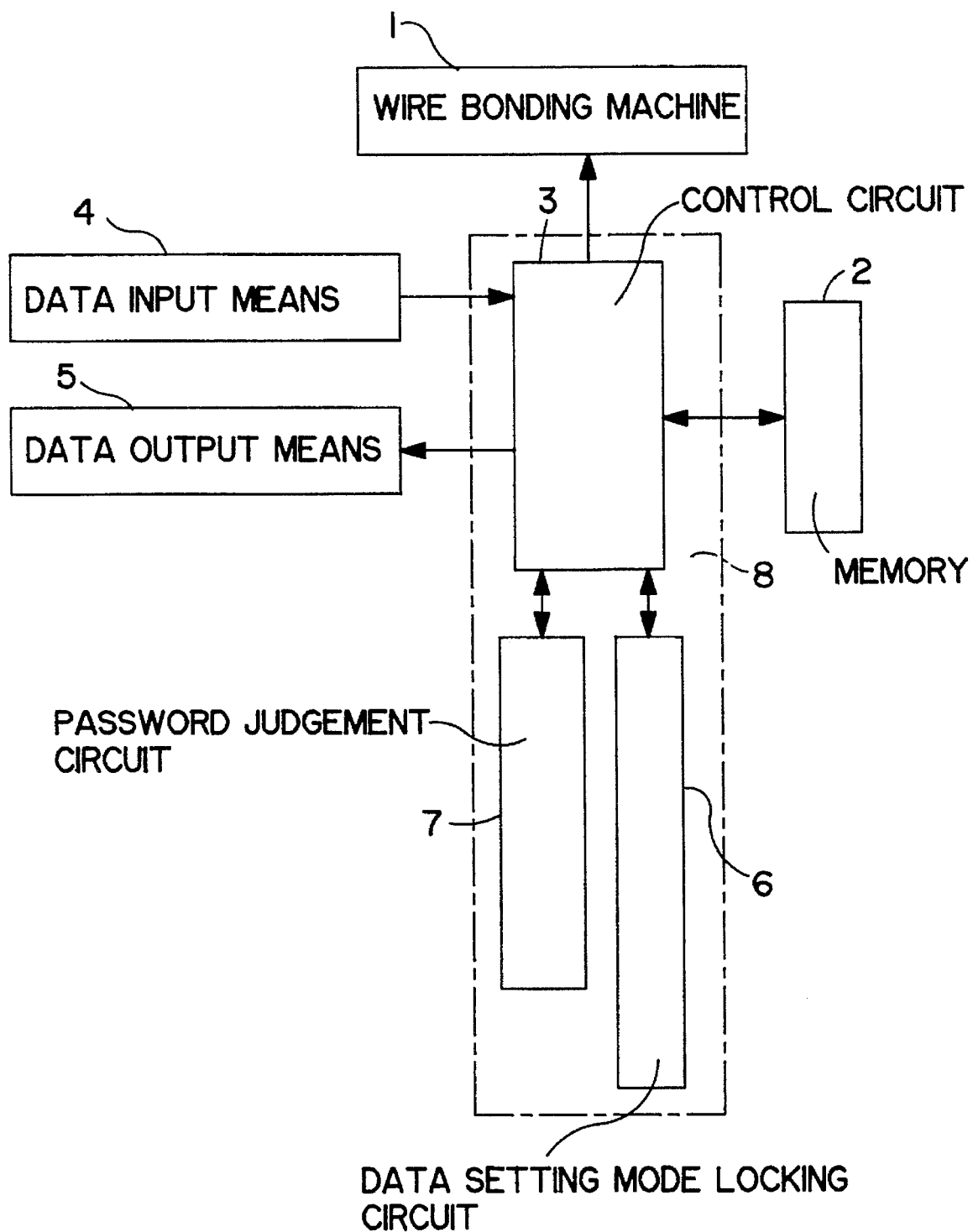
FIG. 1 is a block diagram of one embodiment of the control device used in the present invention.

In this wire bonding machine 1, as shown in FIG. 1, various different categories of data on bonding which are stored in a memory 2 are read out by a control circuit 3. The wire bonding machine 1 is operated by the command from the control circuit 3 so that wires are connected between the bumps of a semiconductor chip and the leads of a lead frame.

Though there are several different setting modes for the data on bonding which are stored in the memory 2, only four data setting modes labeled A through D as listed in Table 1 below will be described as an example for the sake of simplicity.

A data input means (such as a switch, keyboard, etc.) 4 and a data output means (such as monitor) 5 are hooked to the control circuit 3 which is connected to a data setting mode locking circuit 6 and a password judgment circuit 7.

The data setting modes A through D shown in Table 1 are all important, and among these, the data setting mode D is the most important. If data is set in error in this data setting mode D, defective IC's will be manufactured. The parameters of the data setting mode D include for example a bonding load parameter D1, an ultrasonic oscillation time parameter D2, etc. The description below is focussed on the bonding load parameter D1.

The data setting modes A through D are restricted in accordance with the level of bonding knowledge and skill of individual workers. For example, worker A having a high level of skill is given a password (code number) 1357 so that he can change all the data setting modes A through D in Table 1 as well as the data stored in each of the modes A through D, while worker B having an average bonding knowledge and skill is given a password 2468 with which he can change only the data stored in the data setting modes A through C.

TABLE 1

| Items of Data Setting Modes |
| --- |
| A. Self Teaching<br>B. Coordinate Correction<br>C. Bonding Level<br>D. Bonding Parameters |

Figure 2:
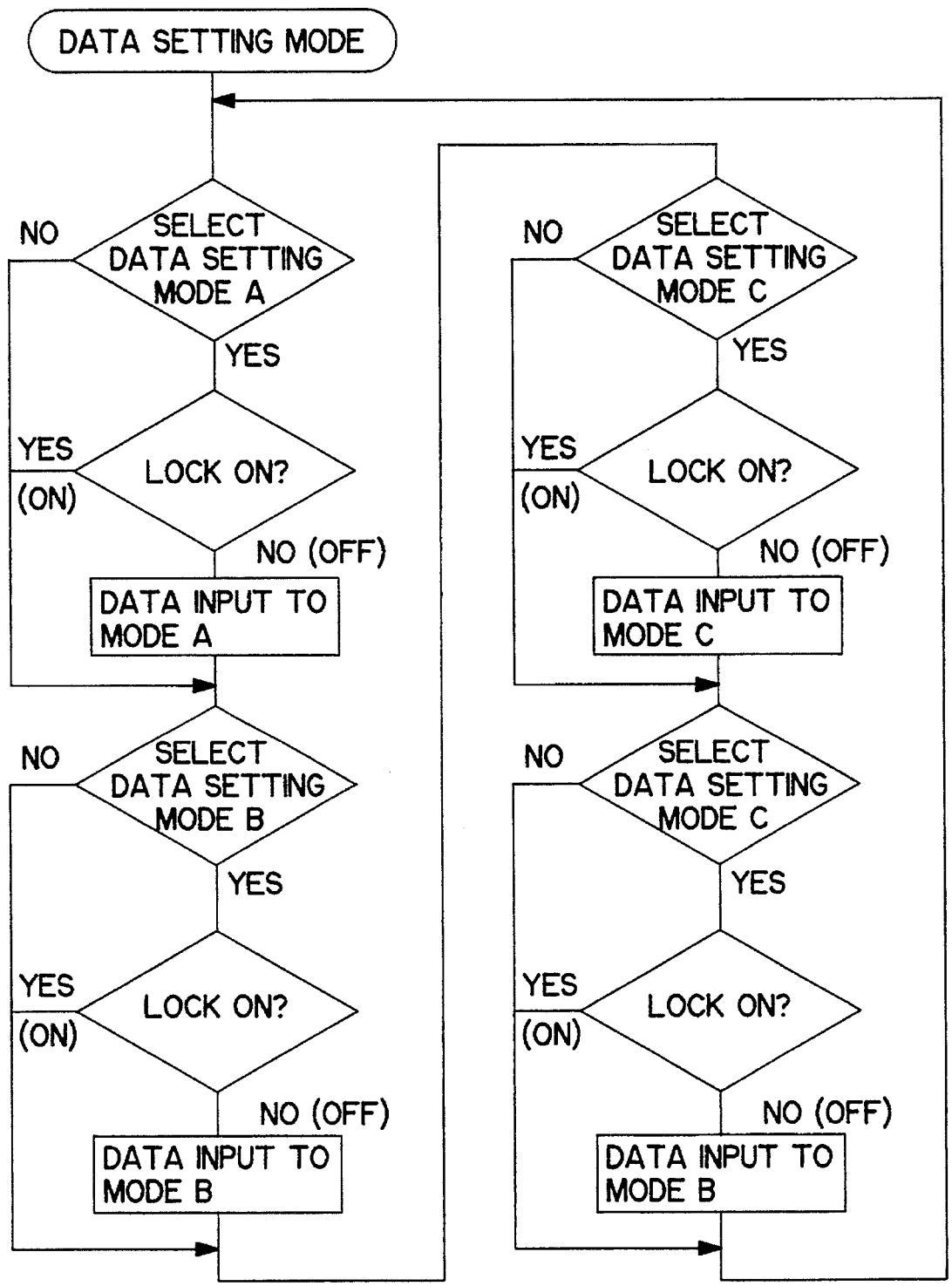
FIG. 2 is a flow chart showing the steps of locking the data setting modes.

First, the data setting mode D is locked via the data input means 4 shown in FIG. 1. This is done as follows: when the data in the data setting modes A through D are read out via the data input means 4, these data setting modes A through D are displayed on the output means or the monitor 5. Then, in accordance with the steps of the flow chart shown in FIG. 2, the data setting modes A through C set to be unlocked (ON), while the data setting mode D is set to be locked. When the locking of this data setting mode D is thus designated, the data setting mode locking circuit 6 is actuated so that the data setting mode D is locked, so that the data stored in the mode D cannot be changed. Before the locking of the mode D, a sub-parameter D1-1, which represents, for example, 50–90 g of bonding load parameter D1 in the data setting mode D is inputted. Once the type of product to be handled is decided, the range D1–1 is also decided accordingly; thus, if the range D1–1 is set at certain limitations (50–90 g in this case), the setting error will be reduced.

Figure 3:
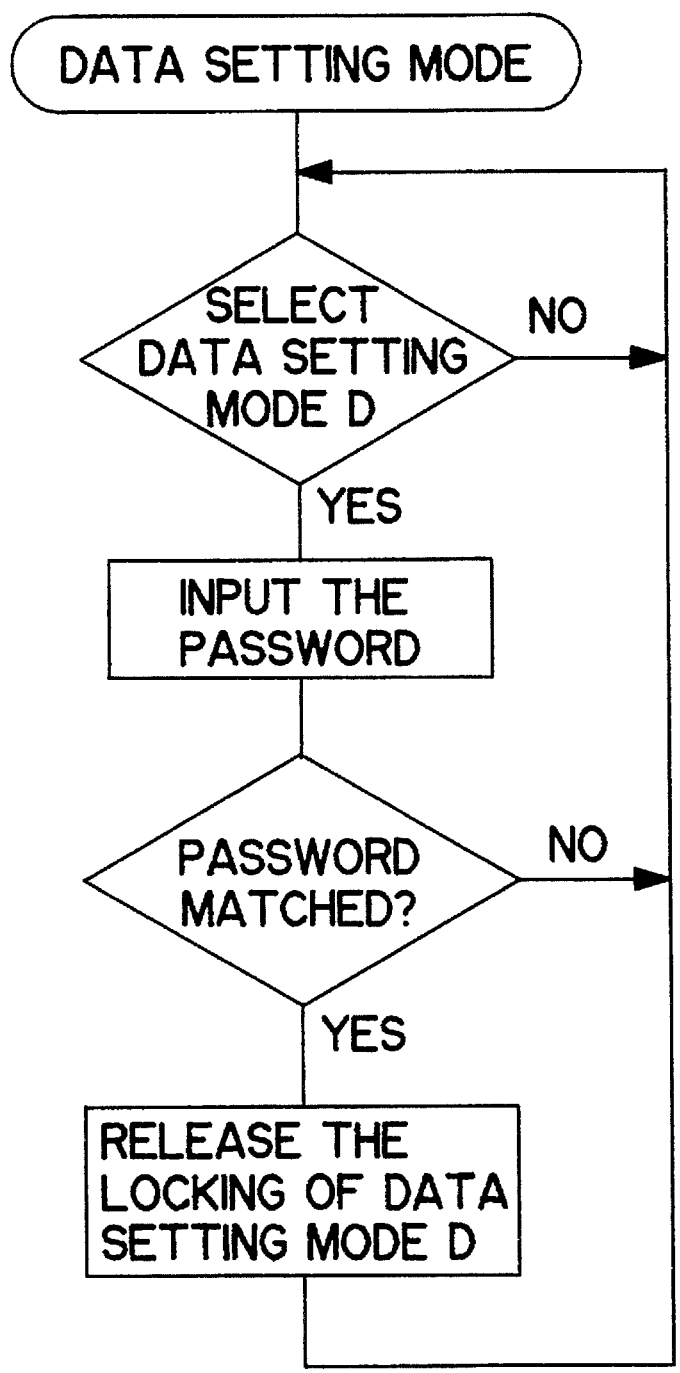
FIG. 3 is a flow chart showing the steps of releasing the locked data setting modes.

The locking of the data setting mode D is released (or unlocked) using the specific password 1357. More specifically, all of the data setting modes A through D are first read out via the data input means 4, and viewing the monitor 5 the data setting mode D is selected as shown in FIG. 3. Then, the password 1357 is inputted via the data input means 4. The inputted password 1357 is checked by the password judgment circuit 7 so as to ascertain whether or not the password matches the previously set value. If the password matches, it is possible that the locking on the data setting mode is released.

The control circuit 3, the data setting mode locking circuit 6 and the password evaluation circuit 7 may be replaced by a computer 8 which contains these circuits.

Figure 4:
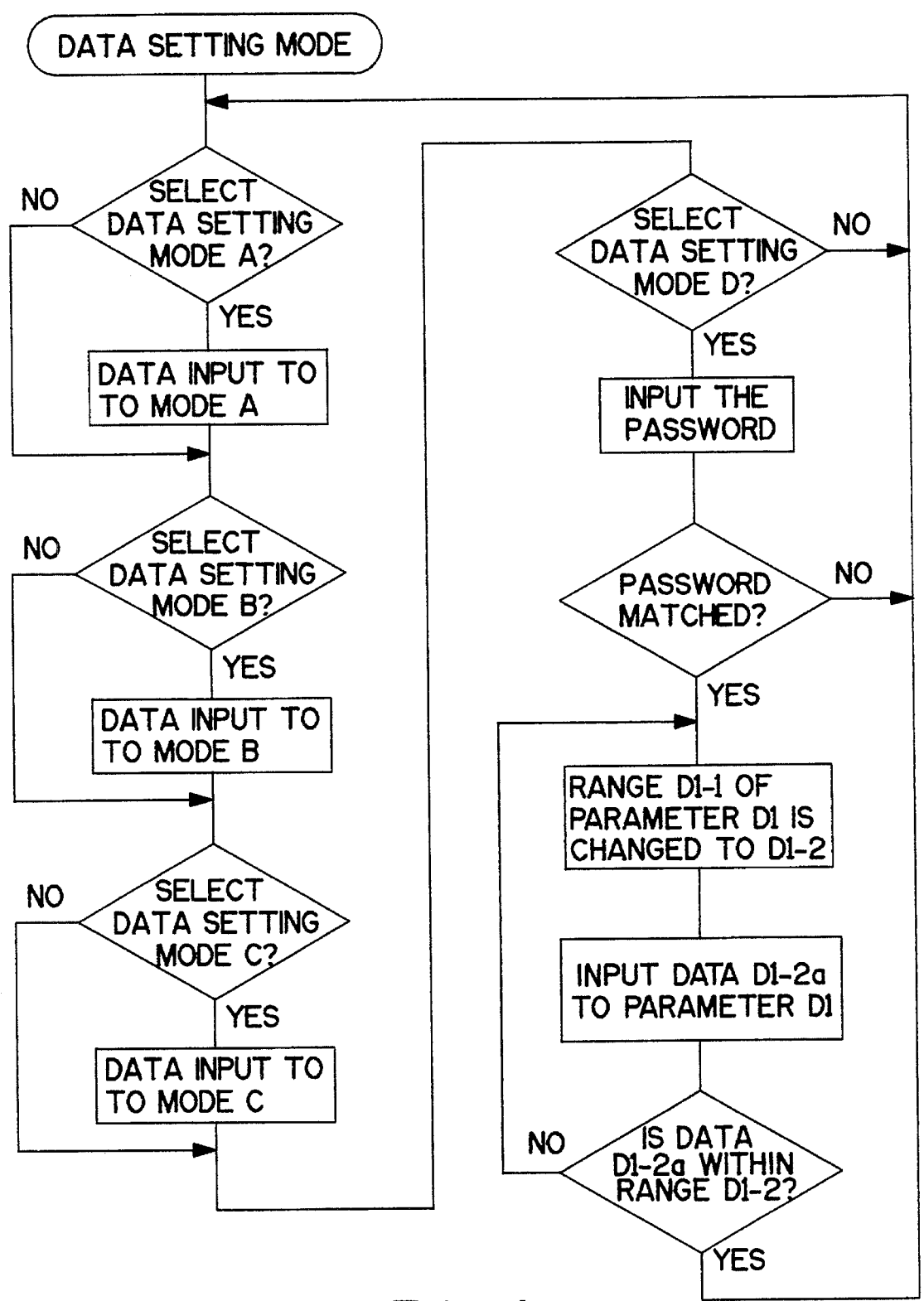
FIG. 4 is a flow chart showing the steps of data settings.

Next, the data setting operation will be described with reference to FIG. 4.

As described above, the data setting modes A through C are not locked, and no specific password is designated for these data setting modes. Accordingly, any worker can access and input data into these data setting modes A through C. More specifically, when the data setting modes A through C are read out via the input means 4, the data setting modes A through D are shown on the monitor 5. Thus, if it is desired to change the data stored in, for example, the data setting mode B, a selection of the data setting mode B is made via the input means 4, and new data that replaces the old one is inputted in the data setting mode B.

However, if a selection of the data setting mode is made so as to select the mode D, access to the mode D is not possible by everyone and can be accomplished only by the operator who has the particular password (1357 in this case) since the data setting mode D is locked so as not to respond to passwords other than the specific one. Accordingly, only workers who have the password that is able to release the locking of the data setting mode D is capable of doing the data setting in the data setting mode D.

For example, if the worker B inputs the password 2468 via the input means 4, since this password does not match the password 1357 which is set beforehand in the control circuit 3, the worker B cannot access the mode D nor change the data therein. However, if the worker A inputs the password 1357, this password is judged to match the password 1357 stored in the control circuit 3; therefore, the worker A is able to access the mode D and set desired data in the mode D.

Furthermore, explanation of data setting will be given below wherein the range D1–1 of the bonding load parameter D1 which is set, as described above, for a 50–90 g range in the memory 2, and the worker A sets the bonding load at 190 g which is out of the 50–90 g range. In this case, the worker A first changes the higher value of the range D1–1, that is, 90 g, to 210 g to make a new range D1–2 which is now 50–210 g. This range has the upper limit 210 g which is greater than the desired value which is 190 g. Then, worker A sets the data D1–2a that is 190 g in the parameter D1. Since this data D1–2a is within the range D1–2, the data D1–2a can be stored in the memory 2. The data of parameter D-1 is thus changed.

As seen from the above, for a wire bonding machine, accessibility to the data setting modes (A through D), in which data setting can be performed via the control device, is set so as to vary in accordance with the level of skill of the workers. Accordingly, error settings can be entirely avoided.

In the embodiment described above, the invention is described relative to a wire bonding machine; however, the present invention can be applied to a die bonding machine and other types of bonding machines.

As described above, according to the present invention, a lock which makes the changing of a designated data item impossible is set on a specific data setting mode item, and the release of the locking and the changing of the data in the locked data setting modes are made possible only by the use of a specific password. Accordingly, various restrictions can be placed on data setting mode items based upon the difference in the skill of the workers, so that control of the bonding machine can be improved and simplified.

We claim:

1. An apparatus for changing data setting modes in a bonding machine, said apparatus comprising:

a memory for storing a plurality of data setting modes which control said bonding machine in a memory;

a data setting mode locking circuit for placing a lock that disallows the changing of data of specific ones of said plurality of data setting modes stored in said memory;

a password judgment circuit for determining whether an inputted password is able to unlock said specific one of said plurality of data setting modes locked by said data setting mode locking circuit; and a control circuit for unlocking said specific one of said plurality of data setting modes which are locked by said data setting mode locking circuit in response to a determination made by said password judgment circuit.

2. A method of changing data setting modes in a bonding machine characterized in that said method comprises:

storing a plurality of data setting modes which control said bonding machine in a memory;

placing a lock that disallows the changing of data of a specific one of said plurality of data setting modes stored in said memory;

determining whether an inputted password is able to unlock said specific one of said plurality of said data setting modes which are locked; and unlocking said specific one of said plurality of said data setting modes which is locked in response to said determination.

* * * * *